US007245120B2

(12) United States Patent
Eldridge et al.

(10) Patent No.: US 7,245,120 B2
(45) Date of Patent: Jul. 17, 2007

(54) PREDICTIVE, ADAPTIVE POWER SUPPLY FOR AN INTEGRATED CIRCUIT UNDER TEST

(75) Inventors: Benjamin N. Eldridge, Danville, CA (US); Charles A. Miller, Fremont, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 11/237,092

(22) Filed: Sep. 27, 2005

(65) Prior Publication Data

US 2006/0022699 A1 Feb. 2, 2006

Related U.S. Application Data

(60) Continuation of application No. 10/725,824, filed on Dec. 1, 2003, now Pat. No. 6,949,942, which is a continuation of application No. 10/206,276, filed on Jul. 25, 2002, now Pat. No. 6,657,455, which is a continuation-in-part of application No. 10/062,999, filed on Jan. 30, 2002, which is a continuation-in-part of application No. 10/003,596, filed on Oct. 30, 2001, which is a division of application No. 09/484,600, filed on Jan. 18, 2000, now Pat. No. 6,339,338.

(51) Int. Cl.
  *G01R 31/28* (2006.01)
(52) U.S. Cl. .................................. 324/158.1
(58) Field of Classification Search ............ None See application file for complete search history.

(56) References Cited

U.S. PATENT DOCUMENTS 4,646,299 A * 2/1987 Schinabeck et al. ........ 714/736
5,070,297 A * 12/1991 Kwon et al. ................ 324/754

(Continued)

FOREIGN PATENT DOCUMENTS

JP          2001-004692       1/2001

(Continued)

OTHER PUBLICATIONS

"Device Test Method Using Power Supply Current Signature Comparison," IBM Technical Disclosure Bulletin, vol. 34, No. 4A, IBM Corp. (Sep. 1, 1991), pp. 253-255.

*Primary Examiner*—Ha Tran Nguyen
*Assistant Examiner*—Richard Isla-Rodas
(74) *Attorney, Agent, or Firm*—N. Kenneth Burraston; Robert Scott Hauser

(57) ABSTRACT

A main power source supplies current through path impedance to a power terminal of an integrated circuit device under test (DUT). The DUT's demand for current at the power input terminal temporarily increases following edges of a clock signal applied to the DUT during a test as transistors within the IC switch in response to the clock signal edges. To limit variation (noise) in voltage at the power input terminal, an auxiliary power supply supplies an additional current pulse to the power input terminal to meet the increased demand during each cycle of the clock signal. The magnitude of the current pulse is a function of a predicted increase in current demand during that clock cycle, and of the magnitude of an adaption signal controlled by a feedback circuit provided to limit variation in voltage developed at the DUT's power input terminal.

12 Claims, 13 Drawing Sheets

U.S. PATENT DOCUMENTS

| | | | |
|---|---|---|---|
| 5,432,797 A * | 7/1995 | Takano | 714/718 |
| 5,476,211 A | 12/1995 | Khandros | |
| 5,506,498 A * | 4/1996 | Anderson et al. | 324/158.1 |
| 5,714,888 A * | 2/1998 | Naujoks | 324/750 |
| 5,731,700 A | 3/1998 | McDonald | |
| 5,917,331 A | 6/1999 | Persons | |
| 5,923,677 A * | 7/1999 | Aihara | 714/738 |
| 5,931,962 A * | 8/1999 | Dang | 714/731 |
| 5,974,662 A | 11/1999 | Eldridge et al. | |
| 6,150,186 A | 11/2000 | Chen et al. | |
| 6,232,759 B1 * | 5/2001 | Wohlfarth | 324/73.1 |
| 6,255,843 B1 * | 7/2001 | Kurihara | 324/765 |
| 6,268,015 B1 | 7/2001 | Mathieu | |
| 6,339,338 B1 | 1/2002 | Eldridge et al. | |
| 6,445,207 B1 * | 9/2002 | Kamimura | 324/765 |
| 6,456,103 B1 | 9/2002 | Eldridge et al. | |
| 6,657,455 B2 | 12/2003 | Eldridge et al. | |
| 6,791,344 B2 * | 9/2004 | Cook et al. | 324/754 |
| 6,949,942 B2 | 9/2005 | Eldridge et al. | |
| 2002/0125904 A1 | 9/2002 | Eldridge et al. | |
| 2004/0113642 A1 * | 6/2004 | Sugimoto et al. | 324/754 |

FOREIGN PATENT DOCUMENTS

WO      WO 01/73929      10/2001

\* cited by examiner

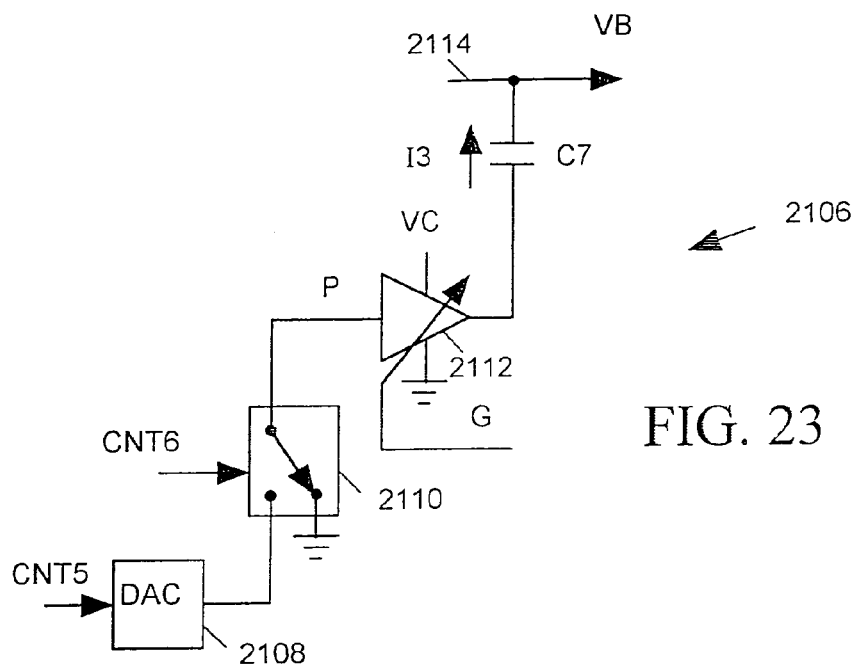
FIG. 23
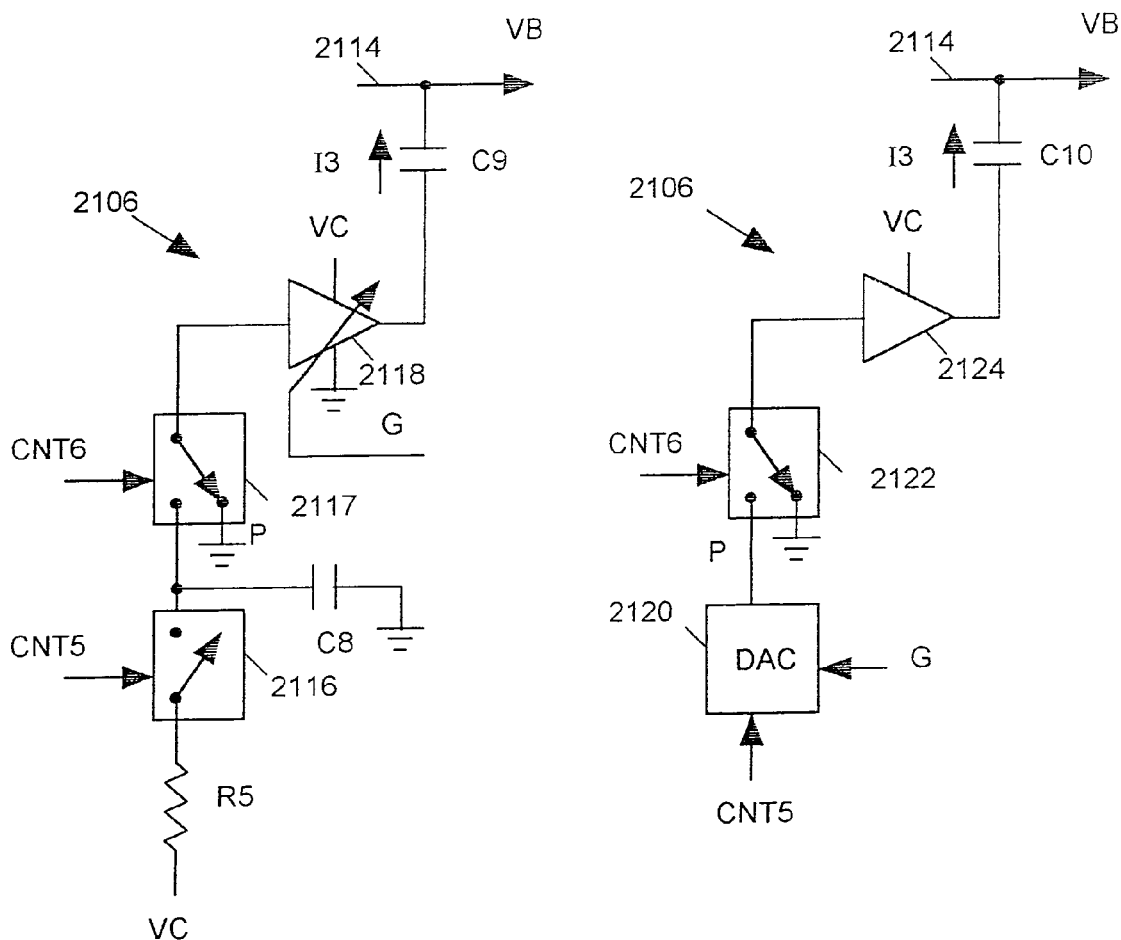
FIG. 24
FIG. 25

PREDICTIVE, ADAPTIVE POWER SUPPLY FOR AN INTEGRATED CIRCUIT UNDER TEST

CROSS-REFERENCE TO RELATED APPLICATIONS

This application is a Continuation of application Ser. No. 10/725,824 filed Dec. 1, 2003 now U.S. Pat. No. 6,949,942 which is a Continuation of application Ser. No. 10/206/276 filed Jul. 25, 2002 now U.S. Pat. No. 6,657,455.

This application is a continuation-in-part of U.S. application Ser. No. 10/062,999 filed Jan. 30, 2002 which is a continuation-in-part of U.S. application Ser. No. 10/003,596, filed Oct. 30, 2001, which is a divisional of U.S. application Ser. No. 09/484,600, filed Jan. 18, 2000, now U.S. Pat. No. 6,339,338 B1.

BACKGROUND OF THE INVENTION

1. Field of the Invention

The present invention relates in general to systems for testing integrated circuits and in particular to an apparatus for reducing power supply noise in an integrated circuit under test resulting from state transitions of the logic it implements.

2. Description of Related Art

An integrated circuit (IC) tester can concurrently test a set of ICs in the form of die on a semiconductor wafer. FIG. 1 is a block diagram illustrating a typical IC tester 10 connected through a probe card 12 to a set of similar IC devices under test (DUTs) 14 which may be formed on a semiconductor wafer. Tester 10 uses pogo pins 15 or other means to connect various input and output terminals to a set of contacts 16 on probe card 12. Probe card 12 includes a set of probes 18 for contacting input/output (I/O) pads 19 on the surface of each DUT 14 and provides conductive paths 20 linking contacts 16 to probes 18. The paths through probe card 12 allow tester 10 to transmit test signals to DUT 14 and to monitor output signals produced by the DUT. Since digital integrated circuits often include synchronous logic gates clocked in response to pulses of a periodic master clock signal (CLOCK), probe card 12 also provides a path 22 through which tester 10 may supply a CLOCK signal to each DUT 14. The test system also includes a power supply 24 for supplying power to DUTs 14 as they are being tested, and probe card 12 connects power supply 24 to a power input pad 26 of each DUT 14 through probes 18.

Each switching transistor within a DUT 14 has an inherent input capacitance, and in order to turn on or off the transistor, the transistor's driver must either charge or discharge the transistor's input capacitance. When a driver charges a transistor's input capacitance it draws charging current from power supply 24. Once the transistor's input capacitance is fully charged, its driver need only supply a relatively small amount of leakage current needed to keep the transistor's input capacitance charged so that the transistor remains turned on or off. In DUTs implementing synchronous logic, most transistor switching occurs immediately after an edge of each CLOCK signal pulse. Thus immediately after each pulse of the CLOCK signal, there is a temporary increase in the power supply current I1 input to each DUT 14 to provide the charging current necessary to change the switching states of various transistors within the DUT. Later in the CLOCK signal cycle, after those transistors have changed state, the demand for supply current I1 falls to a "quiescent" steady state level and remains there until the beginning of the next CLOCK signal cycle.

The signal paths 28 through which probe card 12 connects power supply 24 to each DUT 14 have an inherent impedance represented in FIG. 1 by a resistance R1. Since there is a voltage drop between the output of power supply 24 and the power input 26 of DUT 14, the supply voltage input VB to DUT 14 is somewhat less than the output voltage VA of power supply 24, and although VA may be well-regulated, VB varies with the magnitude of current I1. After the start of each CLOCK signal cycle, the temporary increase in I1 needed to charge switching transistor input capacitance increases the voltage drop across R1, thereby temporarily reducing VB. Since the dip in supply voltage VB occurring after each CLOCK signal pulse edge is a form of noise that can adversely affect the performance of DUTs 14, it is desirable to limit its magnitude and duration. We can limit that noise by reducing the reactance of the paths 28 between power supply 24 and DUTs 14, for example by increasing conductor size or by minimizing the length of path 28. However there are practical limits to the amount by which we can reduce that reactance.

We can also reduce power supply noise by placing a capacitor C1 on probe card 12 near the power supply input 26 of each DUT 14. FIG. 2 illustrates the behavior of supply voltage VB and current I1 at the power input 26 of IC 14 in response to a pulse of the CLOCK signal input to IC 14 when capacitor C1 is insufficiently large. Note that the temporary rise in I1 above its quiescent level IQ following an edge of the CLOCK signal at time T1 produces a temporary increase in voltage drop across R1 that in turn produces a temporary dip in supply voltage VC below its quiescent level VQ.

FIG. 3 illustrates the behavior of VB and I1 when capacitor C1 is sufficiently large. Between CLOCK signal pulses, when DUT 14 is quiescent, capacitor C1 charges to the quiescent level VQ of VB. Following a rising (or falling) edge of the CLOCK signal at time T1, when a DUT 14 temporarily demands more current, capacitor C1 supplies some its stored charge to DUT 14 thereby reducing the amount of additional current power supply 24 must provide to meet the increased demand. As may be seen in FIG. 3, the presence of C1 reduces the magnitude of the temporary voltage drop across R1 and therefore reduces the magnitude of the dip in the supply voltage VB input to the DUT 14.

For capacitor C1 to adequately limit variation in VB, the capacitor must be large enough to supply the needed charge to DUT 14 and must be positioned close to DUT 14 so that the path impedance between C1 and DUT 14 is very low. Unfortunately it is not always convenient or possible to mount a large capacitor on a probe card 12 near the power supply input terminal 26 of each DUT 14. FIG. 4 is a simplified plan view of a typical probe card 12. IC tester 10 resides above the probe card and the wafer containing DUTs 14 is held below the probe card. Since the I/O terminals of IC tester 10 of FIG. 1 are distributed over a relatively large area compared to the surface area of the wafer being tested, probe card 12 provides a relatively large upper surface 25 for holding the contacts 16 the tester accesses. On the other hand, the probes 18 (not shown) on the underside of probe card 12 that contact DUTs 14 on the wafer are concentrated under a relatively small central area 27 of probe card 12.

The path impedance between contacts 16 on the upper surface 25 of card 12 and the probes 18 under area 27 is a function of the distance between each contact 16 and its corresponding probe. To minimize the distance between capacitors C1 and the DUTs, the capacitors should be mounted on probe card 12 near (or above) the small central area 27. However when a wafer includes a large number of ICs to be tested or an IC having a large number of densely packed terminals, there is not enough space to mount the required number of capacitors C1 of sufficient size sufficiently close to central area 27.

SUMMARY OF THE INVENTION

During a test of an integrated circuit device under test (DUT) employing synchronous logic, the DUT experiences a temporary increase in its demand for power supply current after each successive leading or trailing edge of a clock signal input to the DUT. The DUT needs the extra current to charge input capacitance of transistors forming logic devices as they undergo state transitions in response to the clock signal edges. The invention limits variation in power supply voltage at the power input terminal of a DUT arising from the transient increase in power supply current following each clock signal pulse. The invention thereby reduces power supply noise at the DUT's power input terminal.

In accordance with the invention, a charging current pulse is supplied to the DUT's power input terminal after each clock signal edge to supplement a current continuously supplied by a main power supply during the test. The charging current pulse, suitably powered by an auxiliary power supply, reduces the need for the main power supply to increase its output current to meet the DUT's increased demand. With the output current of the main power supply remaining substantially constant despite the DUT's increased demand for current, the voltage drop across path impedance between the main power supply and the DUT remains substantially constant. Thus the supply voltage at the DUT's power input terminal also remains substantially constant.

The amount of additional charging current a DUT requires after each clock signal edge varies depending on the number and nature of state transitions its internal logic devices undergo in response to the clock signal edge. Since a test of an IC requires the IC to carry out a predetermined sequence of state changes, the IC's behavior during a test, including its demand for current during each clock signal edge, is predictable. The magnitude of the current pulse supplied after each clock signal edge is therefore adjusted to suit a predicted amount of additional charging current required by the DUT following each clock signal pulse. The prediction for the increase in current drawn by a DUT following each clock signal edge may be based, for example, on measurements of current drawn by a similar DUT under similar test conditions, or on simulations of the DUT undergoing an analogous test.

Although the amount of charging current an IC of a particular type may draw during any test cycle can be predicted with a fairly high degree of accuracy, the actual amount of additional charging current drawn by any given DUT of that type can be somewhat higher or lower than the predicted amount. Random process variations in the fabrication of ICs make all ICs behave somewhat differently, particularly with respect to the amount of charging current their transistors require during state changes. To compensate for such differences between DUTs, a feedback circuit is provided to monitor the voltage at the DUT's power supply terminal and to appropriately scale the predicted magnitude of the current pulses so as to minimize variations in that voltage.

Thus the magnitude of the current pulse supplied to the power input terminal of a DUT following each clock signal cycle is a function of the predicted magnitude of the additional current drawn by a DUT of that type during that clock signal cycle, but the predicted pulse magnitude is scaled by feedback so as to adapt the prediction to accommodate the variation in charging current requirements for each particular DUT being tested.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

FIGS. 23–25 are block diagrams illustrating alternative exemplary embodiments of the current pulse generator of FIG. 21.

DESCRIPTION OF THE PREFERRED EMBODIMENT(S)

System Architecture

Figure 5:
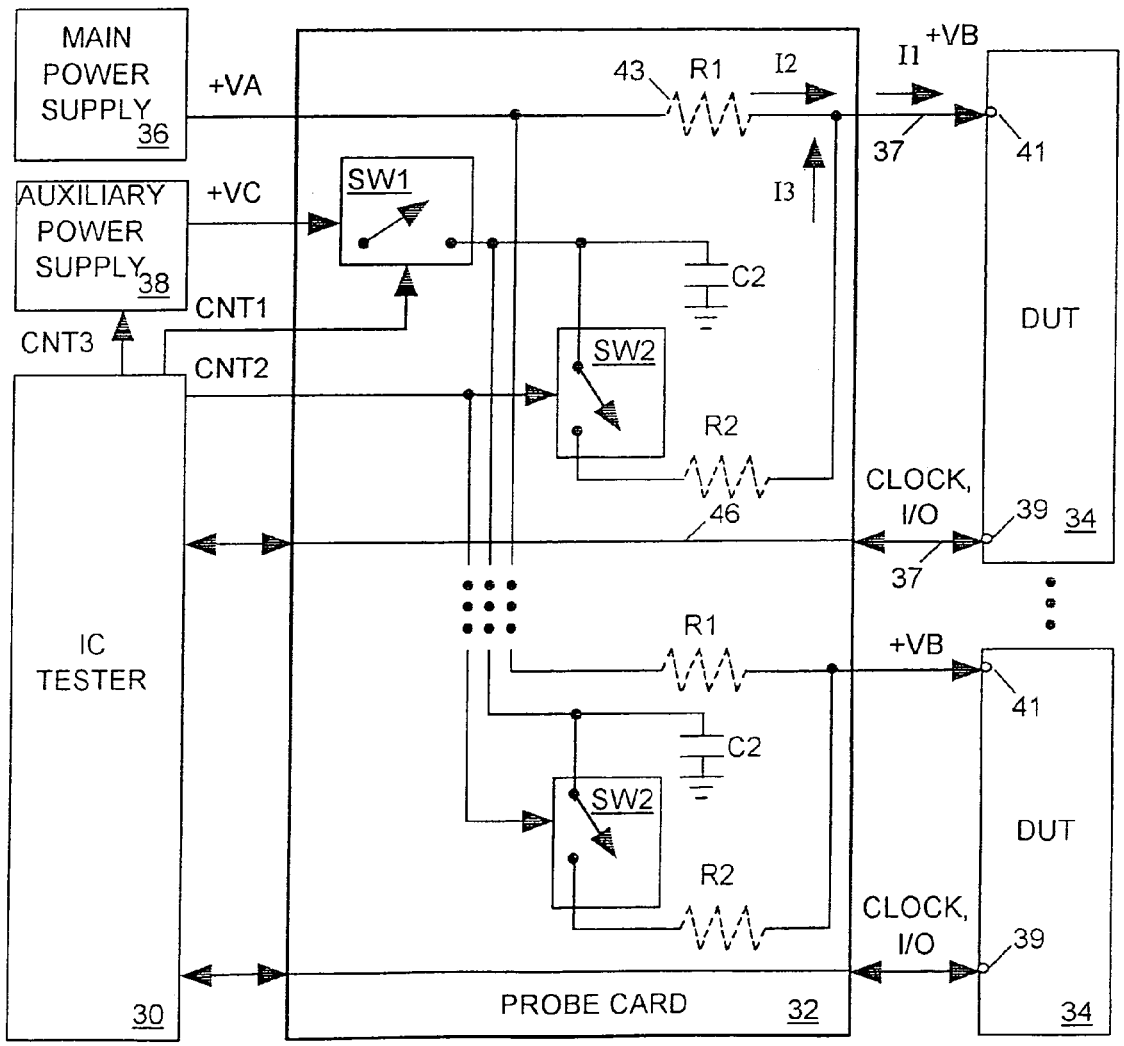
FIG. 5 is a block diagram illustrating a test system implementing a system for reducing noise in the power supply inputs of a set of DUTs in accordance with a first embodiment of the present invention.

FIG. 5 illustrates in block diagram form an integrated circuit (IC) tester 30 linked through a probe card 32 to a set of similar IC devices under test (DUTs) 34 in the form of die on a semiconductor wafer. Probe card 32 includes a set of probes 37 for accessing input/output terminal pads 39 on the surfaces of DUTs 34 and also includes signal paths 46 linking tester 30 to probes 37 to allow IC tester 30 to send a clock signal (CLOCK) and other test signals to DUTs 14 and to convey DUT output signals back to tester 30 so that the tester can monitor the behavior of the DUTs.

Probe card 34 also links a main power supply to a power input terminal 41 of each DUT 34 via conductors passing through the probe card leading to probes 37 extending to terminals 41. Power supply 36 produces a well-regulated output voltage VA and continuously supplies a current I2 to DUT 34. For illustrative purposes, FIG. 5 represents the inherent impedances of the paths 43 through probe card 32 between main power supply 36 and each DUT 34 as resistors R1. Due to a voltage drop across each resistor R1, the input supply voltage VB to each DUT 34 is always somewhat less than VA.

In accordance with the invention, a first transistor switch SW1 mounted on probe card 32 links an auxiliary power supply 38 to a set of capacitors C2 mounted in probe card 32. A set of second transistor switches SW2 also mounted on probe card 32 link each capacitor C2 to the power input terminal of a corresponding DUT 34. A resistor R2 shown in FIG. 5 represents the inherent signal path impedance within probe card 32 between each capacitor C1 and the power input terminal 41 of a DUT 34 when switch SW2 is closed. IC tester 30 provides an output control signal CNT1 for SW1, a control signal CNT2 for controlling switches SW2 and control data CNT3 for controlling the magnitude of the output voltage VC of auxiliary power supply 38. As discussed in detail below, auxiliary power supply 38, switches SW1 and SW2 and capacitors C2 act as an auxiliary current source to inject a current pulse I3 into the power input terminal 41 of each DUT under control of IC tester 30 when necessary to meet any anticipated increase in the DUT's demand for supply current.

Power Supply Noise

DUTs 34 implement synchronous logic in which switching transistors forming logic gates turn on and off in response to pulses of the periodic master CLOCK signal provided by tester 30. Each switching transistor has an inherent input capacitance, and in order to turn on or off the transistor, its driver must either charge or discharge the transistor's input capacitance. When drivers within DUTs 34 charge a transistor's input capacitance, they increase the amount of current I1 that must be supplied to each DUT's power input terminal 41. When the transistor's input capacitance is fully charged, its driver need only supply the relatively small amount of leakage current needed to keep the transistor's input capacitance charged so that the transistor remains turned on or off. Thus immediately after each pulse of the CLOCK signal, there is a temporary increase in the power supply current I1 input to each DUT 34 to provide the charging current necessary to change the switching states of various transistors. Later in a CLOCK signal cycle, after those transistors have changed state, the demand for power supply current falls to a "quiescent" steady state level and remains there until the beginning of the next CLOCK signal cycle. Since the amount of additional current I1 a DUT 34 needs at the start of each CLOCK signal cycle depends on the number and nature of transistors that turn on or off during that particular CLOCK signal cycle, the demand for charging current can vary from cycle-to-cycle.

Figure 1:
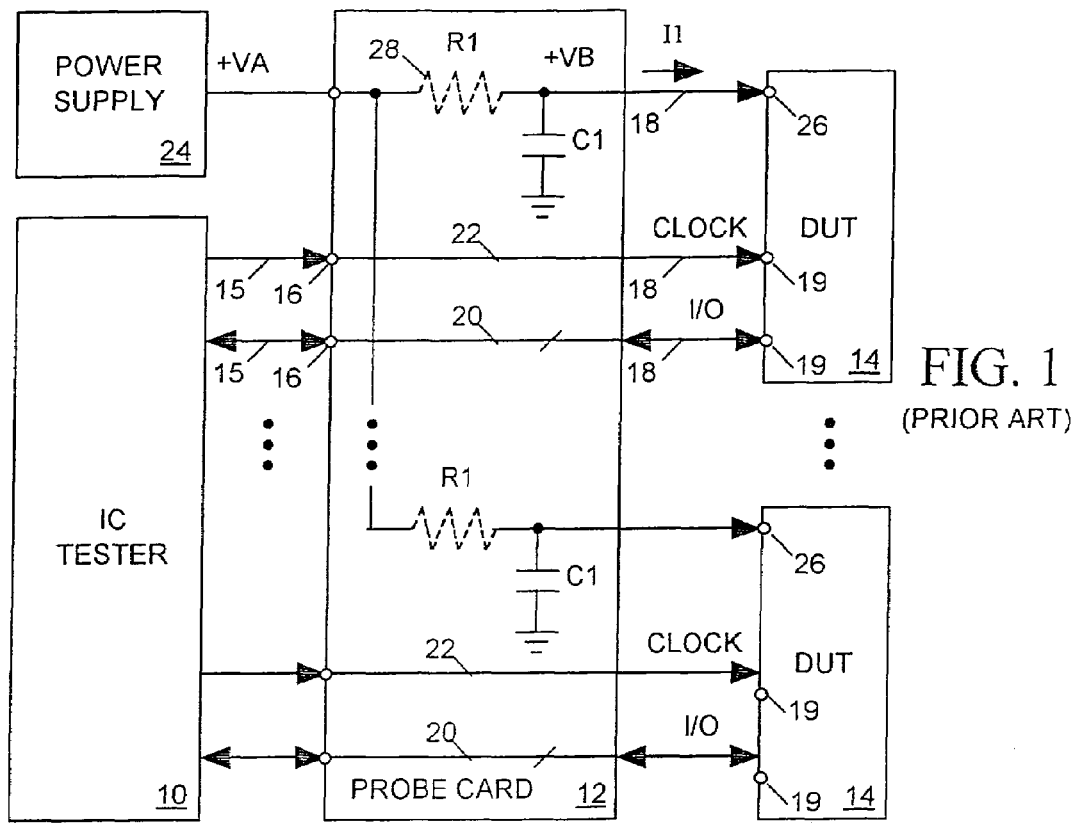
FIG. 1 is a block diagram illustrating a typical prior art test system including an integrated circuit tester connected through a probe card to a set of integrated circuit devices under test (DUTs)
Figure 2:
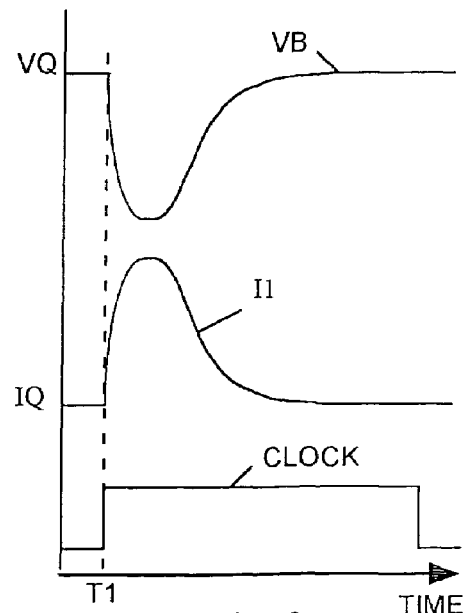
FIGS. 2 and 3 are timing diagrams illustrating behavior of signals within the prior art test system of FIG. 1.
Figure 3:
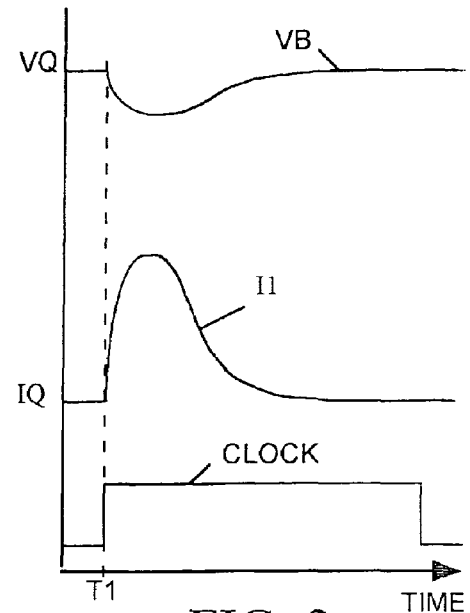

If tester 30 were to always keep switches SW1 and SW2 open, main power supply 36 would always provide all of the current input I1 to each DUT 34. In such case the temporary increase in supply current I1 due to the increased switch activity within each DUT 34 after each CLOCK signal pulse would cause a temporary increase in the voltage drop across the inherent impedance R1 of the signal path 43 between main power supply 36 and DUT 34. This in turn would cause a temporary decline in the voltage VB at the DUT's power input terminal 41. FIG. 2 represents the behavior of VB and I1 when SW2 is always open. Since the dip in supply voltage VB occurring after each CLOCK signal pulse edge is a form of noise that can adversely affect the performance of DUTs 34, it is desirable to limit the magnitude of that voltage dip.

Predictive Current Compensation

In accordance with one embodiment of the invention, IC tester 30 controls auxiliary power supply 38 and the states of switches SW1 and SW2 so that capacitor C2 supplies additional charging current I3 to DUT 34 at the start of each test cycle. The charging current I3, which only flows during an initial portion of each CLOCK signal cycle, combines with the current I2 output of the main power supply to provide the current input I1 to DUT 34. When charging current I3 provides approximately the same amount of charge the capacitance of switching transistors within DUT 34 acquire following a CLOCK signal pulse, there is relatively little change in the current I2 produced by main power supply 36 following the CLOCK signal pulse and therefore very little variation in supply voltage VB.

Thus prior to each CLOCK signal edge, tester 30 supplies data CNT3 to auxiliary power supply 38 indicating a desired magnitude of auxiliary supply voltage VC and then closes switch SW1. Power supply 38 then charges all capacitors C2. The amount of charge capacitors C2 store is proportional to the magnitude of VC. When capacitors C2 have had time to fully charge, tester 30 opens switch SW1. Thereafter, following the start of the next CLOCK signal cycle, tester 30 closes all switches SW2 so that charge stored in capacitors C2 can flow as currents I3 into DUTs 34. Thereafter, when the need for transient charging current has passed, tester 30 opens switches SW2 so that only main power supply 36 supplies current to DUTs 34 during the remaining portion of the CLOCK signal cycle. This process repeats during each cycle of the CLOCK signal with tester 30 adjusting the magnitude of VC via control data CNT3 for each clock cycle so as to provide a current pulse IC sized to satisfy the predicted charging current demand during that particular clock signal cycle. Thus the magnitude of the IC current pulse can vary from cycle-to-cycle.

Figure 6:
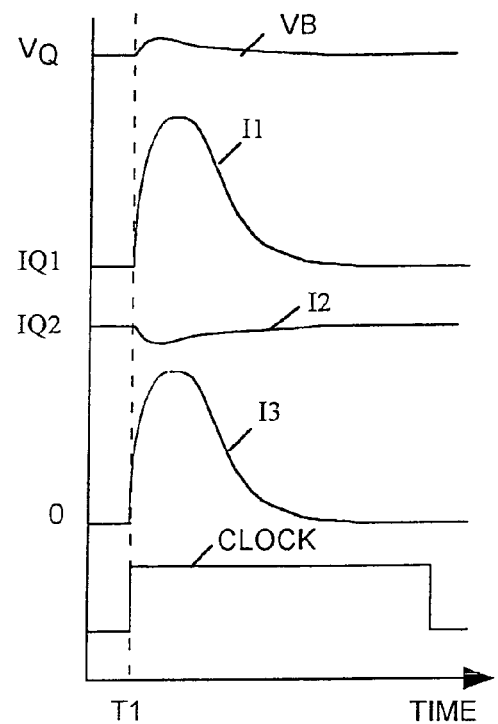
FIG. 6 is a timing diagram illustrating behavior of signals within the test system of FIG. 5.

FIG. 6 illustrates the behavior of supply voltage VB, and currents I1, I2 and I3 during an initial portion of a CLOCK signal cycle. Current I1 exhibits a large temporarily increase above its quiescent level IQ1 after an edge of the CLOCK pulse at time T1 to charge capacitance within the DUT 34. Current I3 rises quickly to provide substantially all the additional charging current. The output current I2 of main power supply 38 exhibits only a relatively small perturbation from its quiescent value IQ2 resulting from small mismatches between I3 and the transient component of I2. Since the variation in I2 is small, the variation in VB is small. Thus the present invention substantially limits the power supply noise due to switching transients in DUTs 34.

Tester Programming

As mentioned above, the amount of additional charging current each DUT 34 draws at the start of a CLOCK signal cycle depends on the number of transistors that turn on or off during the CLOCK signal cycle and charging current varies from cycle-to-cycle. In order to provide proper voltage regulation at DUT terminal 41, tester 30 has to predict how much charge DUT 34 is going to store following each CLOCK signal edge because it has to adjust the magnitude of auxiliary power supply output VC so that capacitors C2 store the proper amount of charge prior to each CLOCK signal cycle.

Figure 7:
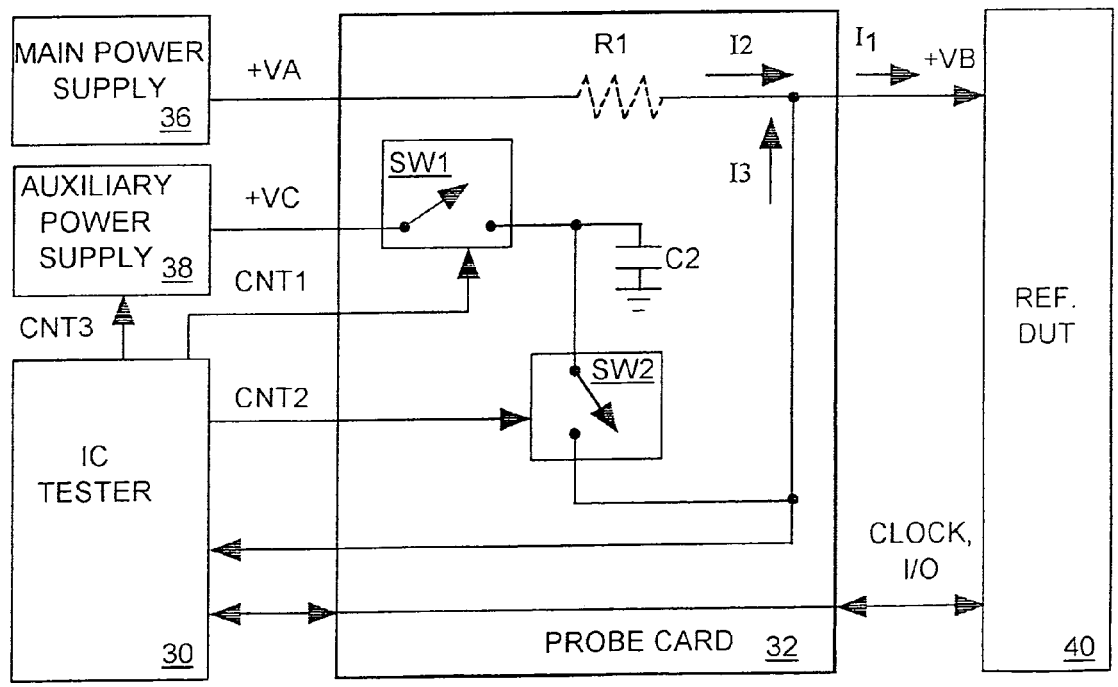
FIG. 7 is a block diagram illustrating operation of the test system of FIG. 5 during a calibration procedure.

FIG. 7 depicts a test system set up that allows tester 30 to experimentally determine the level to which it should set VC for each test cycle. A reference DUT 40 that is known to operate properly and which is similar to the ICs to be tested, is connected to tester 30 via probe 32 in generally the same way DUTs 34 are to be connected so that tester 30 can perform the same test on reference IC 40. However probe card 32 also links the power supply terminal of reference IC 40 to an input terminal of tester 30 so that tester 30 can monitor the power supply voltage VB. Tester 30 then executes only the first CLOCK cycle of the test while observing VB using the minimum value for VC. If VB falls below a desired lower limit during the CLOCK signal cycle, tester 38 repeats the first CLOCK signal cycle of the test using a higher value of VC. This process is repeated iteratively until an appropriate value of VC for the first CLOCK signal cycle is established. The tester then iteratively executes the first two CLOCK signal cycles of the test while monitoring VB during the second CLOCK signal cycle and adjusting VC accordingly. The same procedure is used to establish an appropriate value of VC for each successive CLOCK signal cycle of the test. Those values for VC may then be used when testing DUTs 34.

Designers typically use circuit simulators to simulate ICs before they are fabricated. When a circuit simulator performs the same test on simulated ICs that an IC tester would perform on its real counterpart, the circuit simulator can be employed in an analogous manner to determine the sequence of VC values to be used during a test of the real IC.

Probe Card

Figure 4:
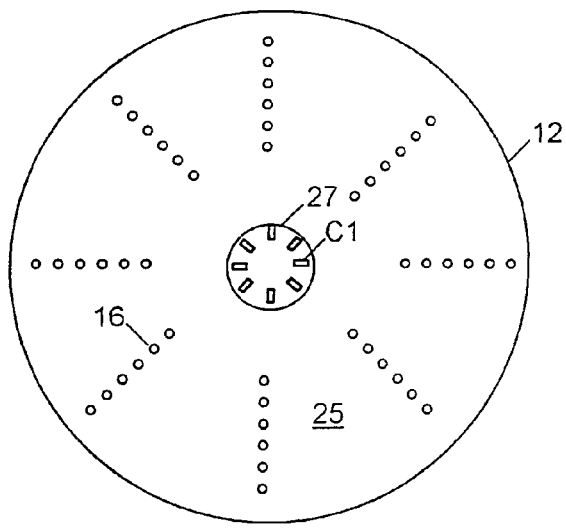
FIG. 4 is a simplified plan view of the prior art probe card of FIG. 1.

FIG. 4 illustrates a typical prior art probe card 12 that connects voltage regulating capacitors C1 to the power input terminals of DUTs to limit power supply noise. Such probe cards must minimize the distance between voltage regulating capacitors and the DUTs so as to minimize the impedance between the capacitors and the DUTs. Thus the capacitors preferably are mounted on the probe card in or near a small area 27 above the probes that access the DUTs. Since there is little space on the probe card near the probes, the size and number of regulating capacitors C1 that can be deployed on probe card 12 is limited. This limitation on capacitor mounting space can limit the number of DUTs that can be concurrently tested.

Figures 8, 9:
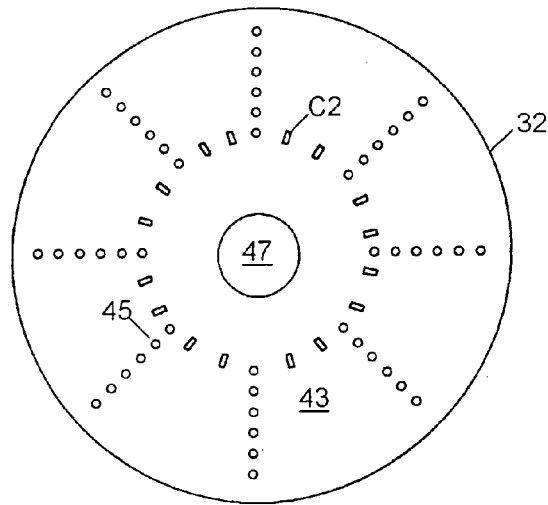
FIG. 8 is a simplified plan view of the probe card of FIG. 6.
FIGS. 9 and 10 are block diagrams illustrating test systems implementing second and third embodiments of the present invention.

FIG. 8 is a simplified plan view of the probe card 32 of FIG. 5 in accordance with the invention. Contact points 45 accessed by IC tester 30 of FIG. 7 are distributed over a relatively large area of the upper surface 43 of probe card 32 while the probes 37 (not shown) that contact DUTs 34 are concentrated under a relatively small central area 47 of the probe card. Since the voltage VC to which capacitors C2 are charged can be adjusted to accommodate significant path impedance R2 (FIG. 5) between any switch SW2 and terminal 41 of DUT 34, capacitors C2 can be mounted on probe card 32 at a significantly greater distance from central area 47 above the DUT probes than capacitors C1 of FIG. 4. Also since capacitors C2 are charged to a higher voltage than capacitors C1, they can be smaller than capacitors C1. Since capacitors C2 of probe card 32 of FIG. 8 can be smaller and further from the center of the probe card than capacitors C1 of the prior art probe card 12 of FIG. 4, a larger number of capacitors C2 can be mounted on probe card 32. Thus a test system employing probe card 32 in accordance with the invention can concurrently test more DUTs than a test system employing a prior art probe card 12 of FIG. 4.

Probe Card With On-Board Pattern Generator

FIG. 9 illustrates an alternative embodiment of the invention including a probe card 50 generally similar to probe card 32 of FIG. 7 except that it has mounted thereon a "power control IC" 52. Power control IC 52 includes a pattern generator 54 that carries out the pattern generation function of IC tester 30 of FIG. 7 with respect to producing the control signals and data CNT1, CNT2 and CNT3 for controlling switches SW1 and SW2 and auxiliary power supply 38. Power control IC 52 includes a conventional pattern generator 54 programmed before the start of a test by externally generated programming data provided via a conventional computer bus 56. Pattern generator 54 begins generating its output data pattern in response to a START signal from an IC tester 58 marking the start of a test and produces its output CNT1, CNT2, CNT3 data pattern in response to the same system clock (SYSCLK) that clocks operations of tester 58.

When the required capacitance C2 is sufficiently small, switches SW1 and SW2 and capacitors C2 may be implemented within power control IC 52 as shown in FIG. 9. IC 52 should be mounted on the probe card as near as possible to the DUT probes. Merging switches SW1 and SW2 and capacitors C2 and the pattern generation function of tester 30 into a single IC 52 reduces the cost and complexity of probe card 32 and reduces the required number of tester 30 output channels. However when necessary capacitors C2 can be implemented by discrete components external to power control IC 52.

Pulse Width Modulated Charge Flow

Figure 10:
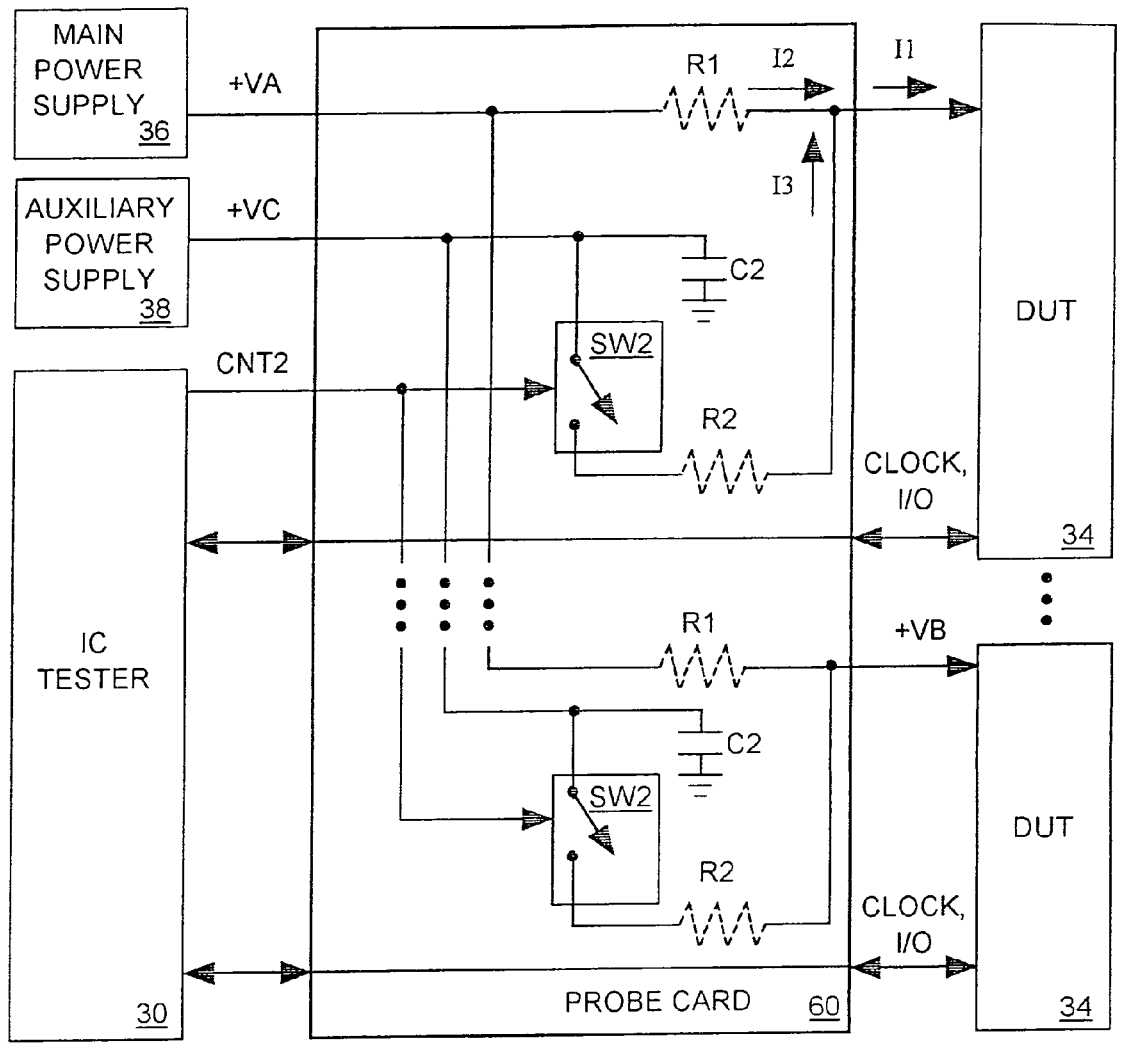
Figure 11:
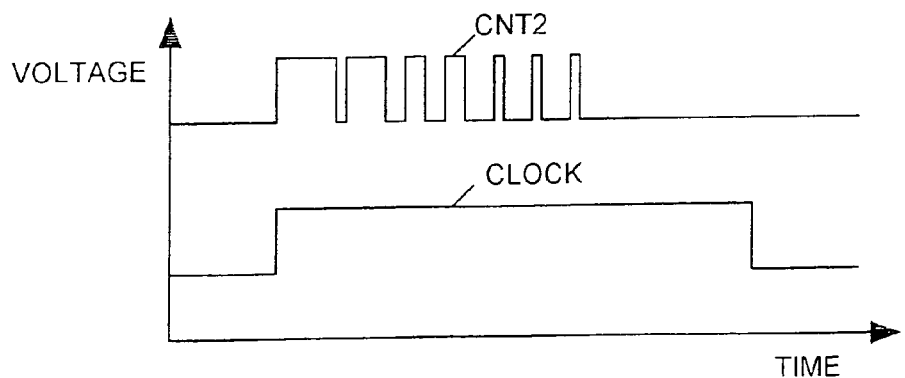
FIG. 11 is a timing diagram illustrating behavior of signals within the test system of FIG. 10.

FIG. 10 illustrates an embodiment of the invention that is generally similar to the embodiment of FIG. 5. However in FIG. 10 switch SW1 is omitted from probe card 60 so that the VC output of auxiliary power supply 38 is directly connected to capacitors C2. Also the output voltage VC is fixed and not adjusted by IC tester 30 so that C2 charges to the same value prior to each CLOCK signal pulse. In this configuration IC tester 30 controls the amount of charge capacitors C2 deliver to DUTs 34 at the start of each CLOCK pulse by pulse width modulating switches SW2 via control signal CNT2. The amount of time tester 30 closes switches SW2 following the leading edge of a CLOCK signal pulse determines the amount of charge capacitors C2 deliver to DUTs 34. Alternatively, the shape of the I3 current flow illustrated in FIG. 6 can be more closely approximated when tester 30 rapidly increases and then decreases the duty cycle of the CNT2 signal as illustrated in FIG. 11.

Analog Modulated Charge Flow

Figure 12:
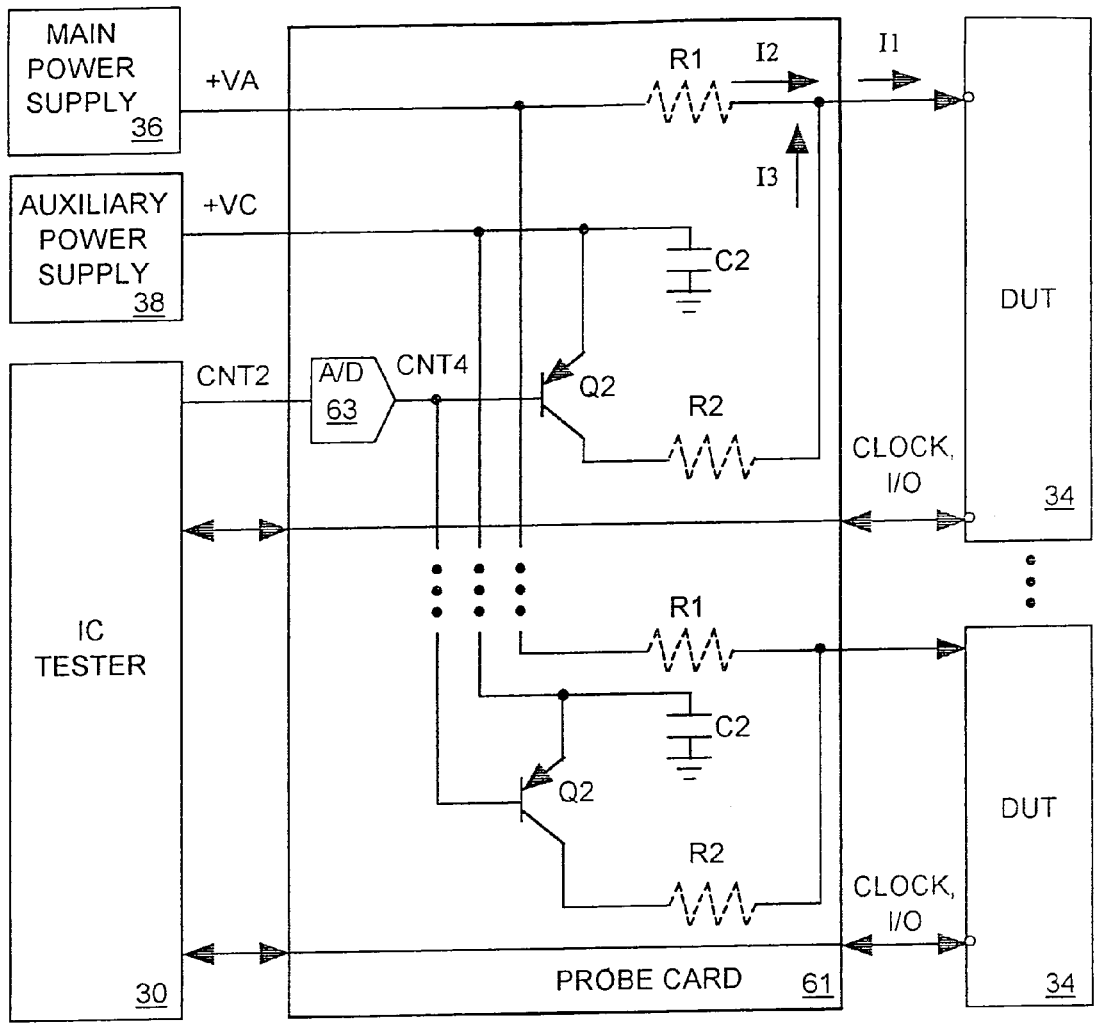
FIG. 12 is a block diagram illustrating a test system implementing a fourth embodiment of the present invention.
Figure 13:
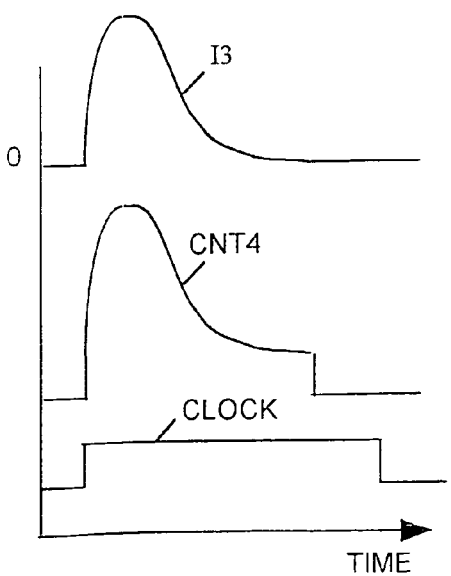
FIG. 13 is a timing diagram illustrating behavior of signals within the test system of FIG. 12.

FIG. 12 illustrates an embodiment of the invention that is generally similar to the embodiment of FIG. 10. However in FIG. 12 the transistor switches SW2 are replaced with transistors Q2 operated in their active regions when DUTs 34 are undergoing state changes and require additional current I3. In this configuration, the CNT2 output of IC tester 30 is a data sequence applied as input to an analog-to-digital (A/D) converter 63 mounted on probe card 61. The data sequence CNT2 represents a predicted demand for charging current I3 during each CLOCK signal cycle. A/D converter 63 responds to the CNT2 data sequence by producing an analog signal CNT4 input to the bases of transistors Q2 that varies during each CLOCK signal cycle as illustrated in FIG. 13. Analog signal CNT4 controls the amount of current I3 each transistor Q2 allows to flow out of a capacitor C2 so that it substantially matches the predicted transient component of the current I1 demanded by DUT 34. A/D converter 63 may be implemented within IC tester 30 instead of being mounted on probe card 61.

Charge Prediction Using Reference DUT

Figure 14:
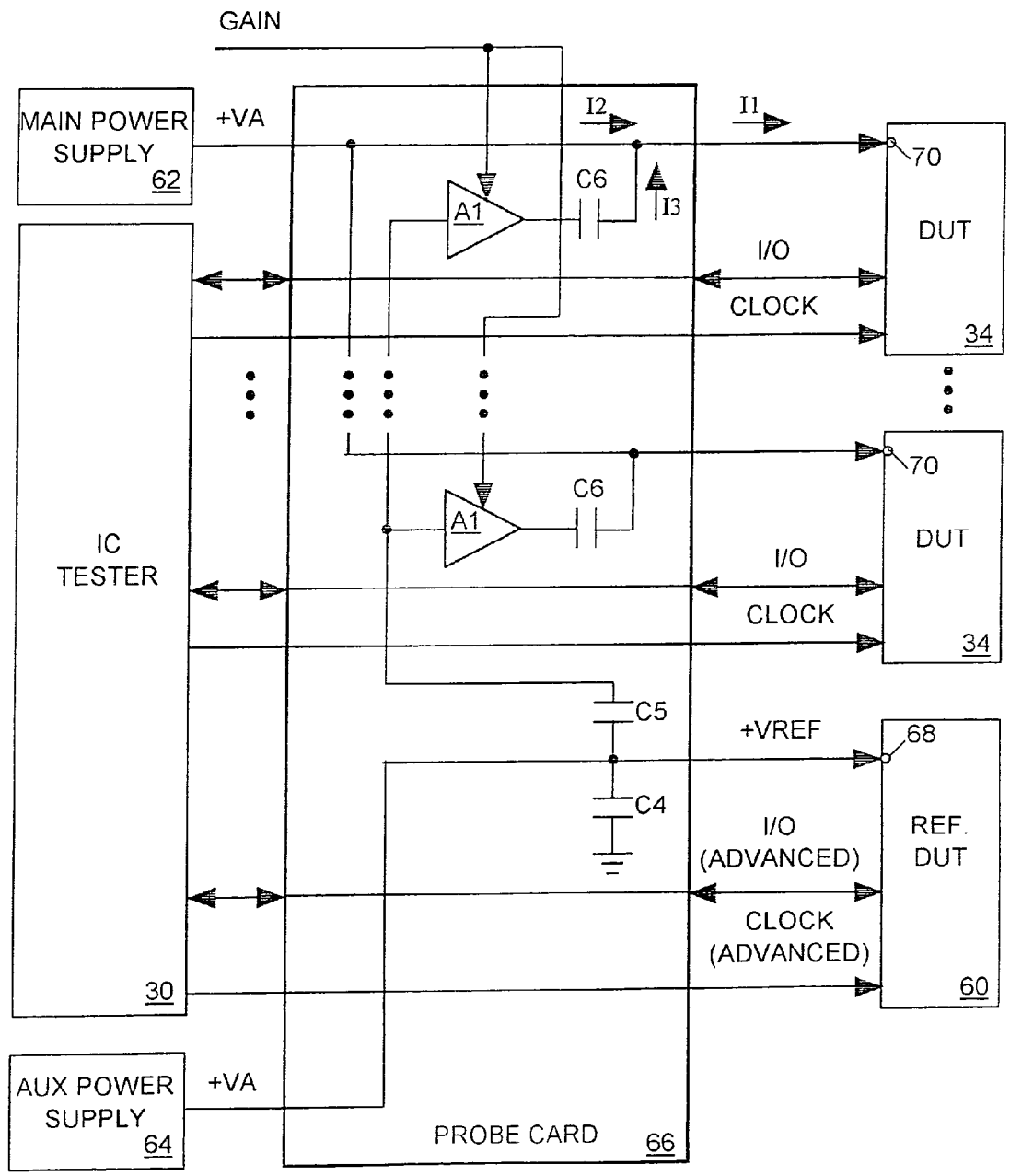
FIG. 14 is a block diagram illustrating a fifth embodiment of the present invention.

FIG. 14 illustrate an embodiment of the invention wherein a reference DUT 60 similar to DUTs 34 is tested in a similar way except that tester 30 tests the reference DUT 60 slightly in advance of the other DUTs by advancing the CLOCK and other input signals it supplies to reference DUT 60. A main power supply 62 powers all DUTs 34 while an auxiliary power supply 64 powers reference DUT 60. A capacitor C4 mounted on probe card 66 near reference DUT 60 regulates the voltage VREF at its power input terminal 68 in a conventional manner so that it stays within its allowed operating range. A capacitor C5 links VREF to a set of amplifier's A1, and a capacitor C6 links the output of each amplifier A1 to the power input terminal 70 of each DUT 34.

Though well-regulated, the supply voltage VREF at the input terminal 68 of reference DUT 60 falls below its quiescent level by a small amount following the start of each CLOCK signal cycle due to the reference DUT's transient charging current demand. The amount of voltage decline in VREF is proportional to the amount of transient charging current drawn by reference DUT 60. Since reference DUT 60 is similar to DUTs 34 and is tested slightly in advance of DUTs 34, a decline in VREF predicts the amount of transient charging current each DUT 34 a short time later.

Amplifiers A1, acting through capacitors C5 and C6, amplify the AC component of VREF to produce output currents I3 that augment the current outputs I2 of main power supply 62 to provide the current input I1 to each DUT 34. The amount of time by which tester 30 advances the test of reference DUT 60 is set to equal the delay between variations in reference voltage VREF and corresponding variations in currents I3. With the (negative) gain of each amplifier A1 appropriately adjusted by an externally generated signal (GAIN), currents I3 will substantially match the transient charging currents required by DUTs 34.

Charge Prediction In Non-Testing Environments

In addition to being useful for reducing power supply noise when testing integrated circuits, embodiments of the present invention can also be employed to reduce power supply noise in application in which an integrated circuit passes though a succession of states that can be predicted.

Figure 15:
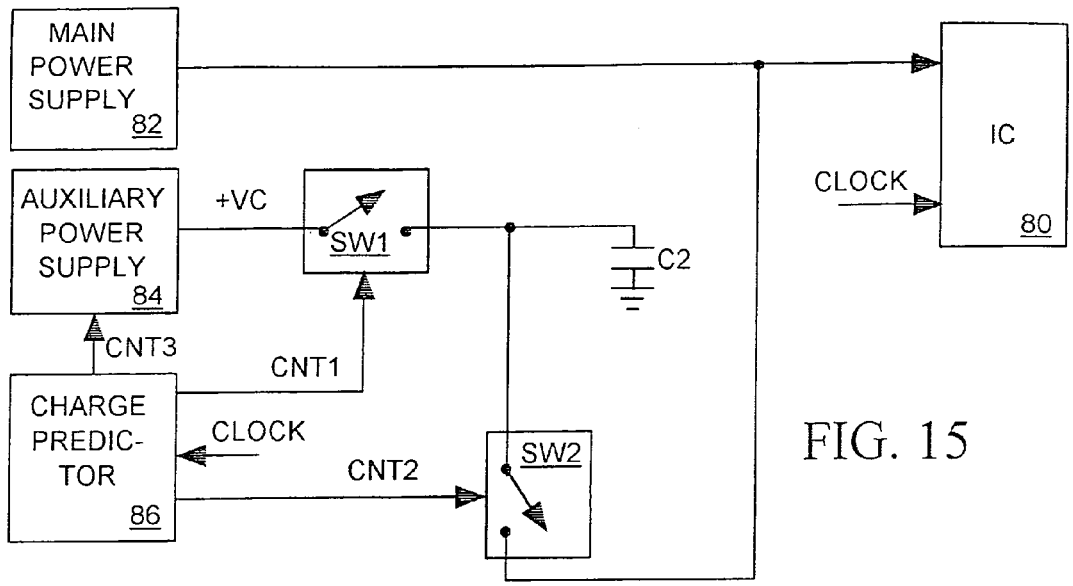
FIG. 15 is a block diagram illustrating a sixth embodiment of the present invention.

FIG. 15 illustrates an example embodiment of the invention in which an integrated circuit 80 passes through a predictable succession of states in response to edges of an externally generated CLOCK signal supplied as input thereto. IC 80 receives power from a main power supply 82. An auxiliary power supply 84 charges a capacitor C2 via a switch SW1 when switch SW1 is closed. Capacitor C2 supplies its charge as additional current input to IC 80 when a switch SW2 is closed. A "charge predictor" circuit 86 responds to the CLOCK signal by asserting a signal CNT1 to close switch SW1 and deasserting a control signal CNT2 to open switch SW2 during a portion of each CLOCK signal cycle in which IC 80 is not changing state. This allows auxiliary power supply 84 to charge capacitor C2 between state changes. Charge predictor circuit 86 asserts control signal CNT2 to close switch SW2 and deasserts control signal CNT1 to open switch SW1 during a portion of each CLOCK signal cycle in which IC 80 is changing state, thereby allowing capacitor C2 to deliver current to the power input of IC 80 to provide its transient current needs. Charge predictor 86 also provides control data CNT2 to auxiliary power supply 84 to adjust its output voltage VC so that it charges capacitor C2 to a level determined in accordance with an amount of current IC 80 is expected to draw during a next state change. Charge predictor 86 is suitably implemented by a conventional pattern generator or any other device capable of producing output data sequences CNT1, CNT2 and CNT3 that are appropriate for transient current requirements of IC 80 for its expected sequence of states. Switches SW1 and SW2 and/or capacitor C2 may be implemented either external to IC 80 as illustrated in FIG. 15 or may be implemented internal to IC 80.

Charge Averaging

Figure 16:
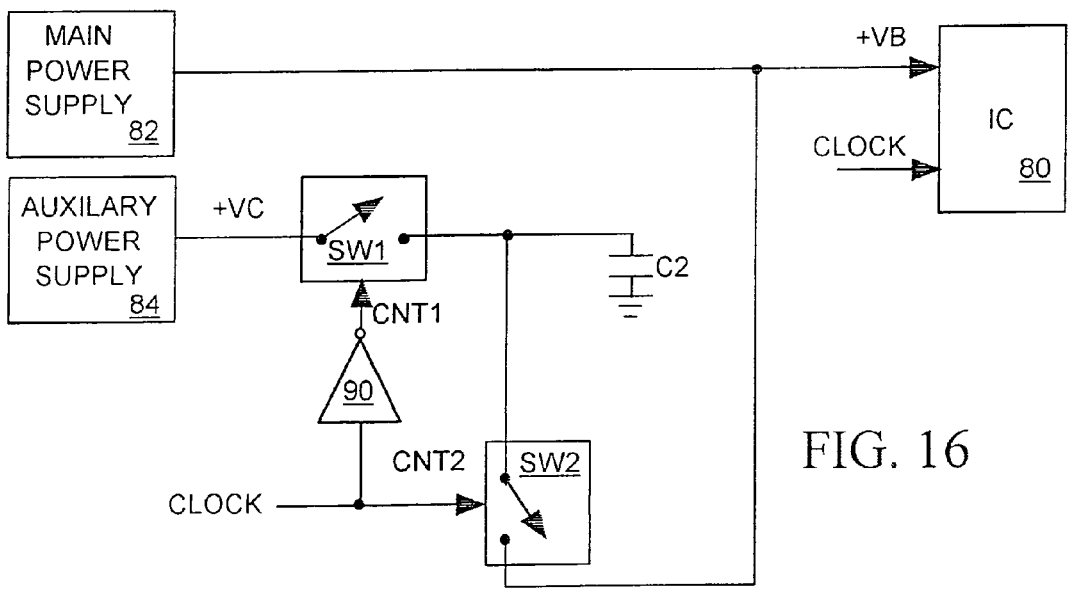
FIG. 16 is a block diagram illustrating a seventh embodiment of the present invention.
Figure 17:
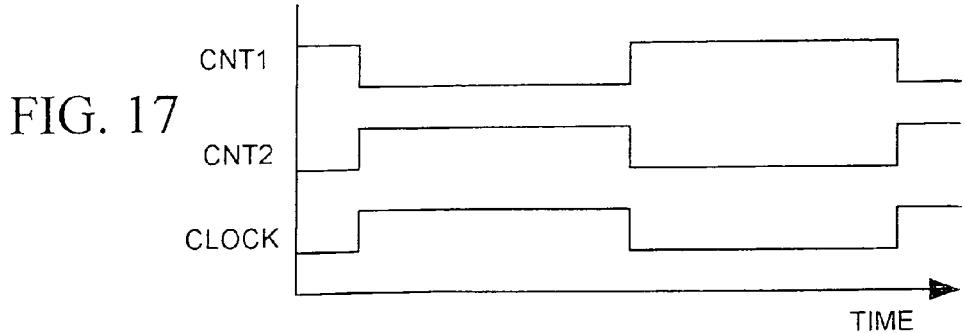
FIG. 17 is a timing diagram illustrating behavior of signals within the circuit of FIG. 16.

FIG. 16 illustrates a simple version of the invention suitable for use in applications wherein the amount of charging current an IC 80 is expected to draw at the start of each CLOCK signal cycle lies within a relatively limited, predictable range. As shown in FIG. 16, an inverter 90 inverts the CLOCK signal to provide the CNT1 control signal input to a switch SW1 coupling a main power supply to a capacitor C2. The CLOCK signal directly provides a CNT2 control signal input to a switch SW2 connecting capacitor C2 to a power input of IC 80 normally driven by a main power supply 82. As illustrated in FIG. 17, the CLOCK signal drives the CNT2 signal high to close switch SW2 during a first half of each CLOCK signal cycle and drives CNT1 high to close switch SW1 during a second half of each CLOCK signal cycle.

The output voltage VC of auxiliary power supply 84 is set to a constant value so that it charges capacitor C2 to the same level prior to the start of each CLOCK signal cycle. The level of VC is set to appropriately position the range over which power supply input voltage VB swings when IC 80 is drawing additional charging current at the start of each CLOCK signal cycle. For example when we want the quiescent value of VB to lie at the middle of its range, we can adjust VC so that capacitor C2 supplies an amount of charging current that is in the middle of the range of charging currents IC 80 is expected to draw. On the other hand, if we want to prevent VB from falling much below its quiescent value but are willing to allow VB to rise above its quiescent value, we can adjust VC so that capacitor C2 supplies the maximum amount of charging current IC 80 is expected to draw. While capacitor C2 may supply too little charging current during some CLOCK signal cycles and too much charging current during other CLOCK signal cycles, in many applications the system illustrated in FIG. 16 nonetheless can keep the swings in VB within acceptable limits when VC is suitably adjusted. Note that the systems of FIGS. 5, 9, 14 and 15 can be programmed to operate in a similar manner by setting control data CNT3 to the same value for every CLOCK signal cycle.

Adaptive Current Compensation

Figure 18:
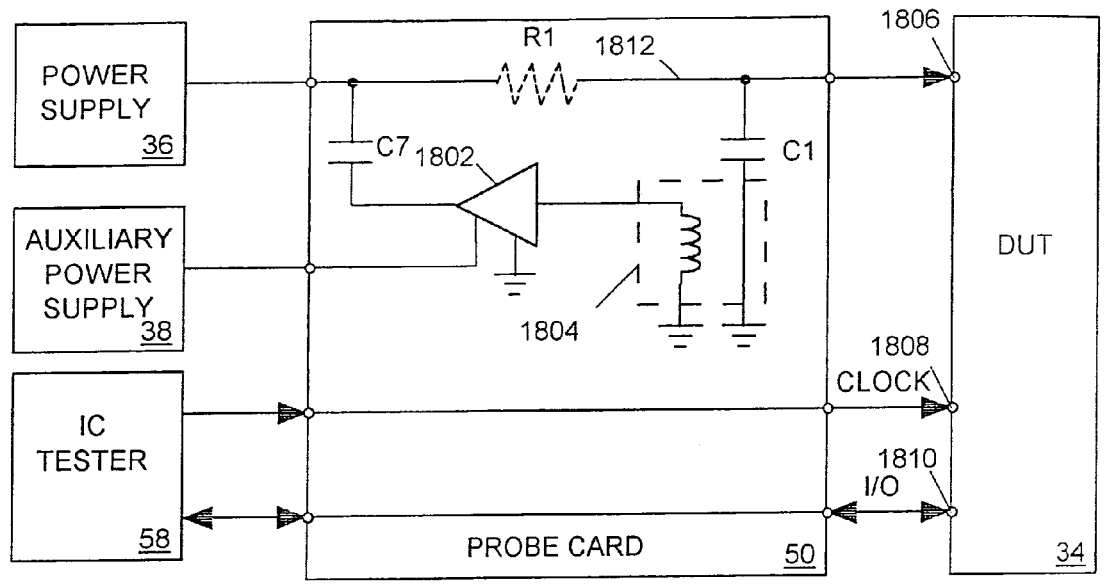
FIG. 18 is a block diagram illustrating an eighth embodiment of the invention.

FIG. 18 illustrates another exemplary embodiment of the invention. As shown in FIG. 18, a power supply 36 provides power through a probe card 50 to a power input terminal 1806 on a semiconductor device under test (DUT) 34. A representation of the inherent impedance through power line 1812 on the probe card 50 is illustrated in FIG. 18 as R1. As also shown in FIG. 18, an IC tester 58 provides clock and other signals through the probe card 50 to the DUT 34. A clock input terminal on exemplary DUT 34 is illustrated as terminal 1808. The IC tester 58 also receives signals through the probe card 50 from the DUT 34. One input/output (I/O) terminal 1810 is shown on DUT 34 in FIG. 18. However, DUT 34 may have additional I/O terminals 1810 or may have terminals dedicated solely to inputs and other solely to outputs or a combination of terminals dedicated to solely inputs or outputs and other terminals that function as both input and output terminals. It should be apparent that probe card 50 may make connections with one DUT as shown in FIG. 18 or a plurality of DUTs, for example, as shown in FIG. 14.

As shown in FIG. 18, a current sensing device 1804 (e.g., a current sense coupler or a current transformer) senses current through bypass capacitor C1. Amplifier 1802, which is preferably an inverting amplifier (e.g., the amplifier has a gain of minus one) provides current through capacitor C7 into transmission line 1812. An auxiliary power supply 38 provides power to amplifier 1802. Of course, power may be supplied to amplifier 1802 by other means, including from power supply 36, IC tester 58, a power supply located on the probe card 50, or a power supply located other than with the power supply 36, IC tester 58, or probe card 50.

In operation, power terminal 1806 typically draws little current, as described above (assuming DUT 34 includes primarily field effect transistors). Only under certain circumstances does power terminal 1806 draw a significant amount of current. As discussed above, the most common of these circumstances arises when at least one transistor in DUT 34 changes state, which typically occurs in correspondence with a rising or falling edge of the clock at clock terminal 1808.

While DUT 34 is not changing states, the small amount of current drawn at power terminal 1806 typically results in only a small and predominantly static direct current (DC) flow or no current flow through bypass capacitor C1. This results in little to no current sensed by current sensing device 1804, and consequently little to no current from inverting amplifier 1802.

While DUT 34 is changing states, however, power terminal 1806 temporarily draws a significant amount of current, as described above. This results in a temporary significant and changing flow of current through bypass capacitor C1, as described above. That current is sensed by current sensing device 1804 and inverted and amplified by inverting amplifier 1802 and ultimately provided through isolation capacitor C7 into power line 1812. As described above, this extra current provided on power line 1812 by amplifier 1802 reduces variations in the voltage at power terminal 1806.

Figure 19:
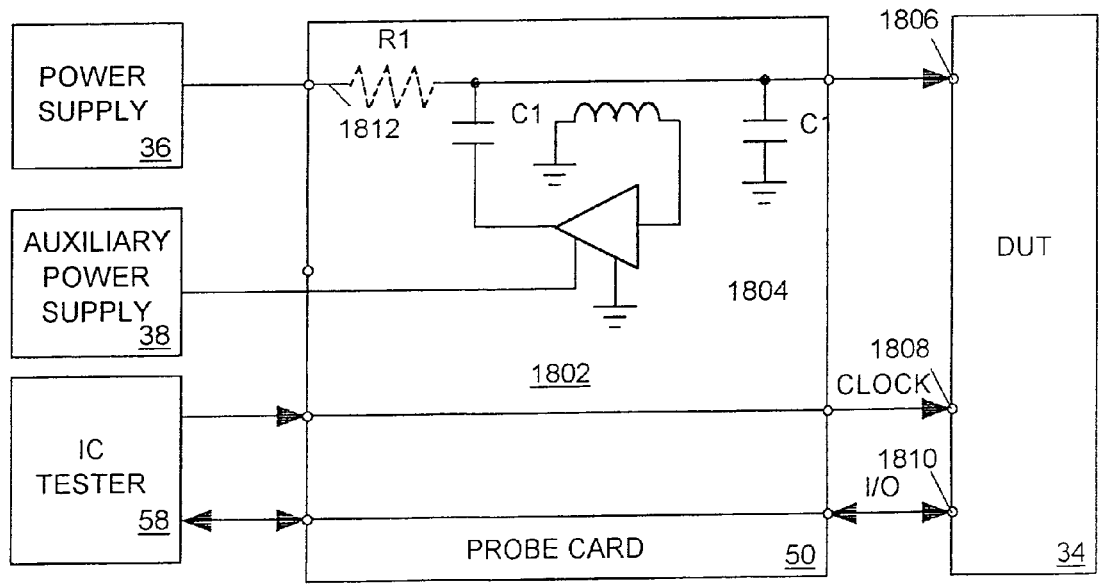
FIG. 19 is a block diagram illustrating a ninth embodiment of the invention.

FIG. 19 illustrates a variation of the exemplary embodiment shown in FIG. 18. As shown, FIG. 19 is generally similar to FIG. 18 and also includes a current sensing element 1804 and an inverting amplifier 1802 configured to provide current to power line 1812 on probe card 50. However, in FIG. 19, the current sensing element 1804 senses current flow through the power line 1812 rather than through bypass capacitor C1.

The embodiment of FIG. 19 operates similarly to that of FIG. 18. While DUT 34 is not changing states, little of the typically small, predominately static direct current (DC) drawn at power terminal 1806 via line 1804 is sensed by current sensing device 1804. Consequently, little or no charging current is provided by inverting amplifier 1802. However, while DUT 34 is changing states, current sensing device 1804 senses the significant variation in current drawn at power terminal 1806 through power line 1804. Inverting amplifier 1802 amplifies and inverts the sensed current to provide additional charging current through isolation capacitor C7 into power line 1812. As described above, the additional charging current reduces variation in the voltage at power terminal 1806.

Interconnect Systems

Figure 20A:
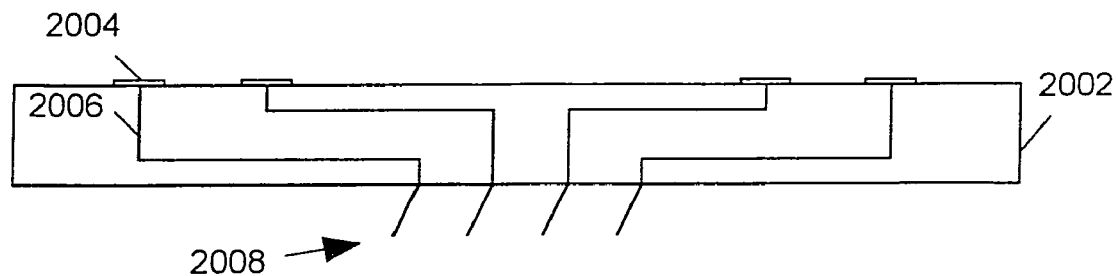
FIG. 20A illustrates an exemplary probe card.

The probe card illustrated in any of the above-described embodiments for providing signal paths between an integrated circuit tester, power supplies and DUTs are exemplary. The invention may be practiced in connection with interconnect systems having a variety of other designs. For example, FIG. 20A illustrates a relatively simple probe card comprising a substrate 2002 with terminals 2004 for connecting to an IC tester (not shown in FIG. 20A) and probe elements 2008 for making electrical connections with a DUT (not shown in FIG. 20A). As shown, terminals 2004 are electrically connected to probe elements 2008 by interconnect elements 2006.

Substrate 2002 may be, for example, a single or multilayered printed circuit board or ceramic or other material. It should be apparent that the material composition of the substrate is not critical to the invention. Probes elements 2008 may be any type of probe capable of making electrical connections with a DUT including without limitation needle probes, COBRA style probes, bumps, studs, posts, spring contacts, etc. Non-limiting examples of suitable spring contacts are disclosed in U.S. Pat. No. 5,476,211, U.S. patent application Ser. No. 08/802,054, filed Feb. 18, 1997, which corresponds to PCT publication WO 97/44676, U.S. Pat. No. 6,268,015 B1, and U.S. patent application Ser. No. 09/364, 855, filed Jul. 30, 1999, which corresponds to PCT publication WO 01/09952, which are incorporated by reference herein. Such spring contacts may be treated as described in U.S. Pat. No. 6,150,186 or U.S. patent application Ser. No. 10/027,476, filed Dec. 21, 2001, which are also incorporated by reference herein. Alternatively, the "probes" may be pads or terminals for making contact with raised elements on the DUT, such as spring contacts formed on the DUT. Non-limiting examples of interconnection paths 2006 include vias and/or a combination of vias and conductive traces located on a surface of substrate 2002 or within substrate 2002.

Figure 20B:
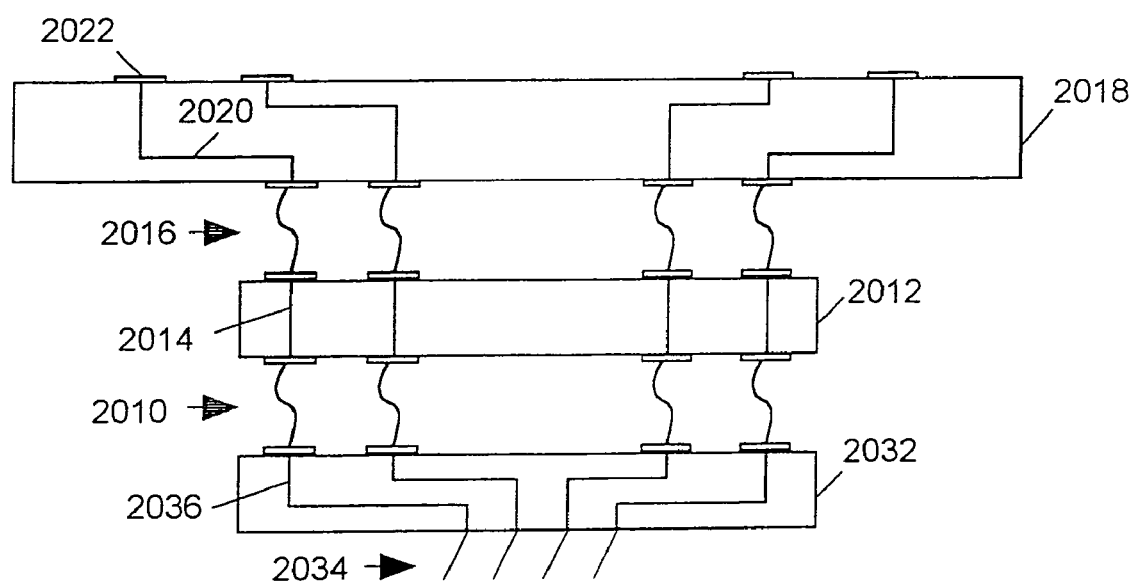
FIG. 20B illustrates another exemplary probe card.

FIG. 20B illustrates another non-limiting example of a probe card that may be used with the present invention. As shown, the exemplary probe card shown in FIG. 20B includes a substrate 2018, an interposer 2012, and a probe head 2032. Terminals 2022 make contact with an IC tester (not shown in FIG. 20B) and probe elements 2034, which may be similar to probe elements 2008 discussed above, make contact with a DUT (not shown in FIG. 20B). Interconnection paths 2020, resilient connection elements 2016, interconnection paths 2014, resilient connection elements 2010, and interconnection paths 2036 provide electrically conductive paths from terminals 2022 to probe elements 2034.

Substrate 2018, interposer 2012, and probe head 2032 may be made of materials similar to those described above with regard to 2002. Indeed, the material composition of substrate 2018, interposer 2012, and probe head 2032 are not critical to the invention, and any composition may be used.

Interconnection paths 2020, 2014, 2036 may be similar to interconnection paths 2006 as described above. Resilient connection elements 2016 and 2010 are preferably elongate, resilient elements. Non-limiting examples of such elements are illustrated in U.S. Pat. No. 5,476,211; U.S. patent application Ser. No. 08/802,054, filed Feb. 18, 1997, which corresponds to PCT publication WO 97/44676; U.S. Pat. No. 6,268,015 B1; and U.S. patent application Ser. No. 09/364, 855, filed Jul. 30, 1999, which corresponds to PCT publication WO 01/09952, all of which have been incorporated by reference herein. A more detailed discussion of an exemplary probe card comprising a plurality of substrates, such as those shown in FIG. 20B, is found in U.S. Pat. No. 5,974,662, which is incorporated by reference herein. Many variations of the exemplary design shown in FIG. 20B are possible. As just one example, interconnection path 2014 may be replaced with a hole and one or more resilient elements 2016 and/or 2010 fixed within the hole and extending out of the hole to make contact with substrate 2018 and probe head 2032.

It should be apparent, however, that the construction or design of the interconnect system is not critical to the invention and any construction or design may be used. As shown in the embodiments described herein, circuitry for reducing variations in the voltage at a power terminal on a DUT is preferably disposed on the probe card. If a multiple-substrate probe card is used, such as the exemplary probe shown in FIG. 20B, the circuitry may be located on any one of the substrates or may be distributed among two or more of the substrates. Thus, for example, the circuitry may be located on one of the probe head 2032, interposer 2012, or substrate 2018 illustrated in FIG. 20B, or the circuitry may be located on a combination of two or more of the probe head, the interposer, and/or the substrate. It should be apparent that the circuitry may be formed entirely of interconnected discrete circuit elements, may be formed entirely on an integrated circuit, or may consist in part of discrete circuit elements and in part of elements formed on an integrated circuit.

Predictive/Adaptive Current Compensation

As discussed above, a predictive system for controlling variation in supply voltages at a DUT's power input terminal predicts the amount of charging current the DUT will require during each clock signal cycle and then sizes the supplemental current pulse applied to the DUT's power input terminal during that clock signal cycle in accordance with the prediction. An adaptive system, on the other hand, monitors the power signal applied to the DUT's terminal and uses feedback to adjust the magnitude of the supplemental current pulse to keep the power signal's voltage constant.

Figure 21:
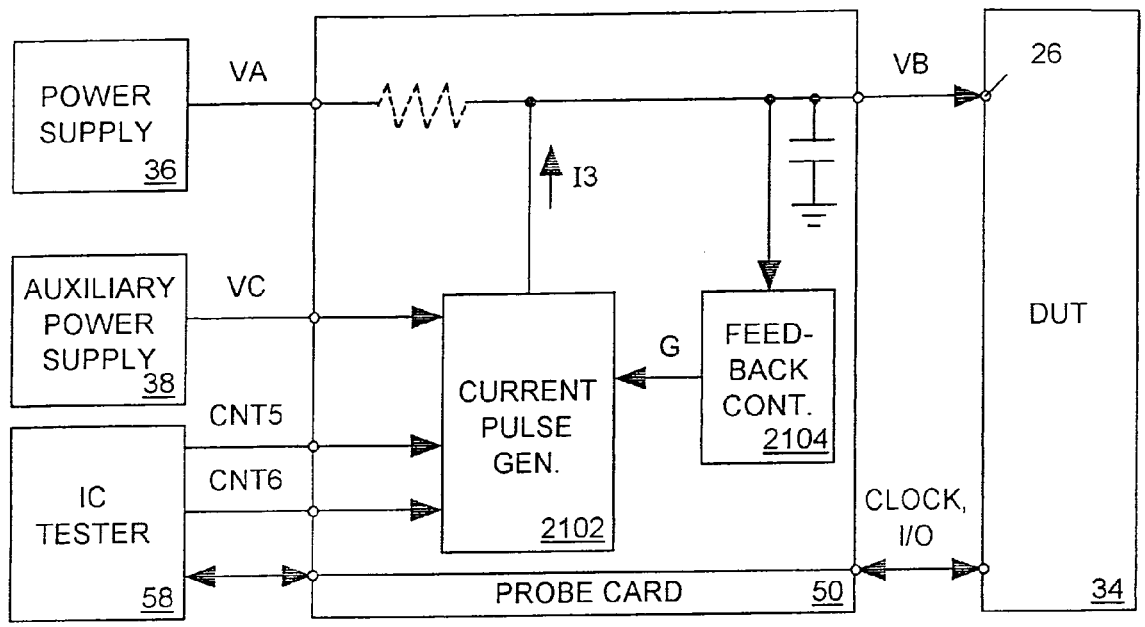
FIG. 21 is a block diagram illustrating a ninth embodiment of the invention.

FIG. 21 illustrates an embodiment of the invention in which the amount of additional charging current needed at the power input terminal 26 of DUT 34 is determined by a combination of prediction and adaption. Auxiliary power supply 38 supplies power VC to a current pulse generator 2104 which supplies a current pulse I3 to DUT power input terminal 26 when necessary to augment the normal supply current from main power supply 36. At the start of each test cycle, IC tester 58 supplies a signal CNT5 to current pulse generator 2102 indicating a predicted magnitude of the current pulse, and during each test cycle, IC tester 58 asserts a control signal CNT6 to tell current pulse generator 2102 when to generate the current pulse.

IC tester 58 is programmed to test a particular type of DUT 34 and the predictions that it makes with respect to the size and duration of current pulse I3 needed during each test cycle may, as previously discussed, be based either on measurements of current drawn by a DUT of that type, or on a simulation of DUT behavior. However due to process variations in the manufacture of the DUTs and other factors, the magnitude of additional charging current each DUT of that type may require during each test cycle can vary from the predicted charging current. For any given DUT, a ratio of actual charging current drawn to predicted charging current tends to be relatively uniform on a cycle-by-cycle basis. For example one DUT might consistently draw 5% more charging current during each test cycle than the predicted charging current while another DUT of the same time might consistently draw 5% less than the predicted charging current during each test cycle.

A feedback controller 2104 compensates for such variation in charging current requirements from predicted values by supplying an adaptive gain (or "adaption") signal G to current pulse generator 2102 which appropriately increases or decreases the magnitude of current pulse I3 to adapt the current pulse to suit the requirements of the particular DUT 34 currently under test. Thus the prediction signal CNT5 represents the predicted magnitude of the charging current demanded by DUTs of the type being tested whereas the gain ("adaption") signal magnitude represents the prediction error for the particular instance of the DUT being tested.

Before testing DUT 34, IC tester 58 carries out a pretest procedure that may be similar to the test to be performed in that it sends test and CLOCK signal pulses to DUT 34 causing it to behave in generally the same way the DUT would during the test. During the pretest procedure, feedback control circuit 2104 monitors the voltage VB at the DUT's power input terminal 26 and adjusts the magnitude of the gain signal G to minimize variations in VB that occur when the magnitude of I3 is too large or too small. The pretest procedure allows feedback controller 2104 time to adjust the magnitude of gain signal G to accommodate charging current demand of the particular DUT 34 to be tested. Thereafter, during the test, feedback controller 2104 continues to monitor VB and to adjust gain signal, but the adjustments it makes are small. Thus while the magnitude of the charging current pulse I3 supplied during each test cycle is a primarily a function of the DUT's predicted charging current demand, the gain control feedback provided by controller 2104 finely adjusts the current pulse magnitude to accommodate any consistent propensity of the DUT's actual charging current demand to vary from the predicted demand.

Those of skill in the art will appreciate that feedback controller 2104 of FIG. 21 may be of any of a variety of designs capable of producing an output gain control signal G that will minimize variations in VB. Those of skill in the art will also appreciate that current pulse generator may be any of a variety of designs capable of producing a current pulse I3 wherein the timing of I3 is controlled by an input signal CNT6 and wherein the magnitude of I3 is a function of the current pulse magnitude represented by the control signal CNT5 and the magnitude of an adaptive gain signal G.

Figure 22:
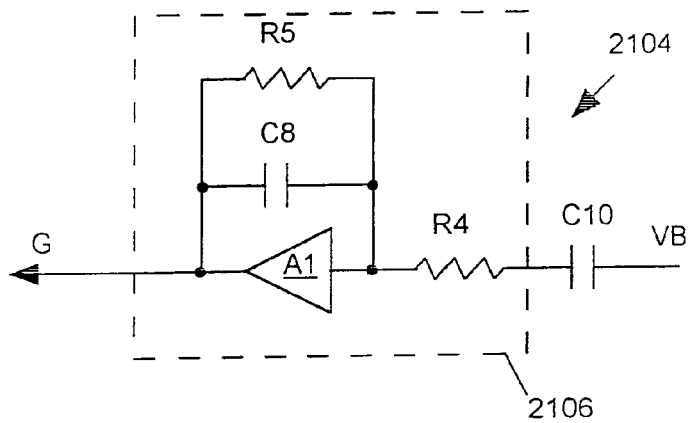
FIG. 22 is a block diagram illustrating an exemplary embodiment of the feedback control circuit of FIG. 21.

FIG. 22 illustrates one non-limiting example of feedback controller 2104 which integrates the AC component of VB to produce gain control signal G. A DC blocking capacitor C10 passes the AC component of VB to an integrator 206 formed by an operational amplifier A1 connected in parallel with a capacitor C8 and a resistor R5 and having a resistor R4 in series with its input.

FIG. 23 depicts one non-limiting example of current pulse generator 2106 of FIG. 21. In this example, the control signal CNT5 conveys data representing the predicted magnitude of the required current pulse I3. A digital-to-analog converter (DAC) 2112 converts the prediction data for the current test cycle into an analog signal P of magnitude proportional to the prediction data. When IC tester 58 asserts the CNT6 signal to indicate when current pulse I3 is to be produced, a switch 2110 closes to apply signal P to an input of a variable gain amplifier 2112 powered by the VC output of auxiliary power supply 38 of FIG. 21. The gain control signal output of feedback controller 2104 of FIG. 21 controls the gain of amplifier 2112. Amplifier 2112 produces an output current pulse I3 of magnitude that is proportional to the product of P and G. A capacitor C7 passes the I3 signal pulse to the signal path 2114 within probe card 50 of FIG. 21 that conveys power to DUT 34.

FIG. 24 depicts another non-limiting example of current pulse generator 2106 of FIG. 21. In this example the length of time IC tester 58 of FIG. 21 asserts the CNT5 control signal is proportional to the predicted magnitude of current pulse I3 needed during a next CLOCK signal cycle. After current pulse generator 2102 generates each pulse of the I3 signal, IC tester 58 asserts the CNT5 signal to close a switch 2116 coupling the auxiliary supply output signal VC to a capacitor C8 via a resistor R5. IC tester 58 continues to assert the CNT5 signal for an amount of time that increases with the predicted magnitude of the next I3 signal pulse. Thus auxiliary power supply 38 of FIG. 21 charges capacitor C8 to a voltage that is proportional to the predicted magnitude of the next I3 signal pulse. Thereafter, when IC tester 58 assets the CNT6 signal to indicate that the next I3 signal pulse is to be generated, a switch 2117 connects capacitor C8 to the input of an amplifier 2118 having a gain controlled by the gain control signal output G of feedback controller 2104 of FIG. 21. A coupling capacitor C9 delivers the resulting I3 signal to the probe card conductor 2114 that delivers power to DUT 35 of FIG. 21. Control signal CNT6 opens switch 2117 after capacitor C8 has had time to substantially discharge. Since the magnitude of the I3 current pulse rises quickly and then declines as C8 discharges, the time-varying behavior of the I3 pulse tends to mimic the DUT's time-varying charging current demand.

FIG. 25 depicts another non-limiting example of current pulse generator 2106 of FIG. 21 wherein data conveyed by the CNT5 signal represents the predicted magnitude of the I3 signal pulse. The gain control signal G acts as a reference voltage for a DAC 2120 converting the data conveyed by the CNT5 signal into an analog signal P. The voltage of gain control signal G scales defines the range of the DAC output signal P so that the P is proportional to a product of G and CNT5. A switch 2122 temporarily delivers the P signal to an amplifier 2124 in response to a pulse of the control signal CNT6, thereby causing amplifier 2125 to send an I3 signal pulse to power conductor 2114 via a coupling capacitor C10. The IC signal pulse magnitude is proportional to the product of the magnitudes of G and P.

Figure 26:
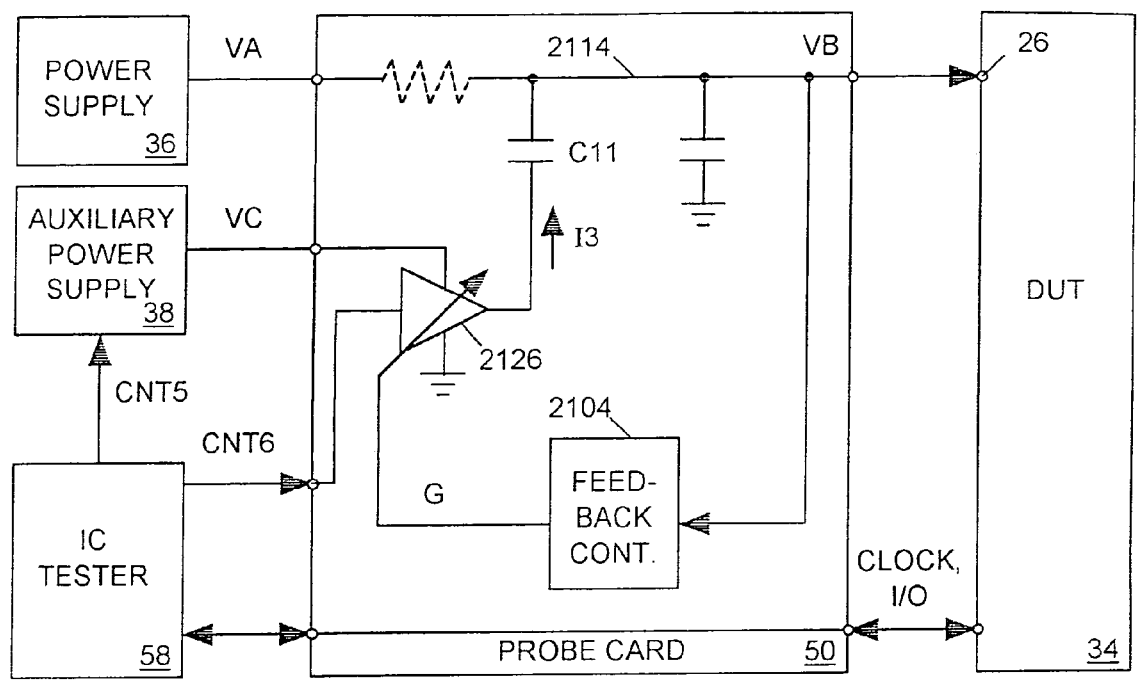
FIG. 26 is a block diagram illustrating a tenth embodiment of the invention.

FIG. 26 illustrates another exemplary embodiment of a predictive/adaptive system in accordance with the invention wherein auxiliary power supply 38 supplies power to a variable gain amplifier 2126, and IC tester 58 supplies a control signal pulse CNT6 to amplifier 2126 whenever it predicts that additional charging current will be needed at the power input terminal 26 of DUT 34. A capacitor C11 delivers the I3 signal pulse to the power signal path 2114 within probe card 50 linking main power supply 36 to DUT power input terminal 26. Feedback control circuit 2104 monitors the voltage VB appearing at terminal 26 and adjusts the gain of amplifier 2126 to minimize the variation in VB. IC tester 58 supplies control signal CNT5 as input to auxiliary power supply 38 at the start of each CLOCK cycle for setting its output voltage VC in accordance with the magnitude of data conveyed by the CNT5 control signal. The magnitude of I3 is therefore a function of the product of magnitudes of gain control signal G and auxiliary supply voltage VC Thus FIGS. 21–26 depict various exemplary embodiments of a predictive/adaptive control system in accordance with the invention for regulating the voltage of a power signal VB applied to DUT 34 by providing additional charging current to the DUT's power input terminal 26 after each edge of the CLOCK signal to meet a temporary increase in current demand due to switching initiated by the CLOCK signal edge. The control system is "predictive" in that it predicts the amount of additional current that the DUT will require during each cycle of the test. The control system is also "adaptive" in that it employs feedback to scale the current pulses it generates in response to the prediction to accommodate observed variations in the magnitude of current actually drawn by the individual DUTs to be tested.

While the invention is illustrated herein as reducing noise in a system employing only a single main power supply, it will be appreciated that the invention can be employed in environments in which more than one main power supply provide power to DUTs.

While the invention is illustrated as operating in connection with DUTs having a single power input, it will be appreciated that the apparatus can be adapted to operate in connection with DUTs having multiple power inputs.

While the invention is described as providing additional charging current following a leading edge of a CLOCK signal pulse, it may be easily adapted to provide additional charging current following a trailing edge of the CLOCK signal pulse for use with DUTs that switch on trailing CLOCK signal edges.

While various versions of the invention have been described for use in connection with an IC tester of the type employing a probe card to access terminals of ICs formed on semiconductor wafers those of skill in the art will appreciate that the invention may be employed in connection with IC testers employing other types of interface equipment providing access to DUT terminals of ICs that may still be at the wafer level or that have been separated from the wafer on which they were formed and which may or may not be incorporated into packages at the time they are tested. Such interface equipment includes, but is not limited to load boards, burn-in boards, and final test boards. The invention in its broadest aspect is not intended to be limited to applications involving any particular type of IC tester, any particular type of tester-to-DUT interconnect system, or any particular type of IC DUT. It should also be understood by those of skill in the art that while the invention is described above as being employed in connection with the testing of integrated circuits, it may also be employed when testing any kind of electronic device including, for example, flip-chip assemblies, circuit boards and the like, whenever precise regulation of voltage at the power input terminals of the device during the test is desirable.

Therefore, while the forgoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. A method of testing a semiconductor device using a test apparatus, comprising:

creating a demand record of expected input demand at a power terminal of the semiconductor device correlated in time with a test sequence for the semiconductor device;

testing the semiconductor device in accordance with the test sequence; and providing during the testing power to the semiconductor device in accordance with the demand record, wherein the providing power comprises:

generating a first supply of power to the power terminal of the semiconductor device; and selectively generating a second supply of power to the power terminal of the semiconductor device in accordance with the demand record such that the second supply of power is provided substantially concurrently with an expected increase in demand for current at the power terminal.

2. The method of claim 1, wherein the providing power comprises using the demand record to adjust the behavior of the test apparatus.

3. The method of claim 1, wherein the providing power further comprises generating a timing signal to regulate an amount of the second supply of power provided to the power terminal of the semiconductor device.

4. The method of claim 1, wherein creating the demand record comprises applying signals to a reference semiconductor device and measuring a power demand of the reference semiconductor device with respect to time.

5. The method of claim 1, wherein creating the demand record comprises simulating a power demand of the semiconductor device with respect to time.

6. The method of claim 1, wherein the generating a second supply of power comprises providing the second supply of power to the semiconductor device correlated in time to test cycles of the test sequence.

7. The method of claim 1, wherein the input is voltage.

8. The method of claim 1, wherein the input is power.

9. The method of claim 1, wherein the input is current.

10. The method of claim 1, wherein the testing includes using a probe card.

11. A testing apparatus for a semiconductor device, comprising:

a demand recorder for recording a demand record of expected input demand at a power terminal of the semiconductor device correlated in time with a test sequence for the semiconductor device; and a probe card configured to facilitate testing the semiconductor device in accordance with the test sequence; and power means for providing power to the semiconductor device in accordance with the demand record, wherein the power means comprises:

a primary power supply for providing a supply of power to the power terminal of the semiconductor device; and an auxiliary power supply for providing an auxiliary supply of power to the power terminal in accordance with the demand record such that the auxiliary supply of power is provided substantially concurrently with an increase in demand for current at the power terminal.

12. The testing apparatus of claim 11, wherein the auxiliary power supply is disposed on the probe card.

* * * * *